(12) United States Patent
Nakamura

(10) Patent No.: US 11,162,990 B2
(45) Date of Patent: Nov. 2, 2021

(54) CALIBRATION ARRANGEMENT AND METHOD FOR DERIVING A RESISTANCE OF A RESISTOR

(71) Applicant: Advantest Corporation, Tokyo (JP)

(72) Inventor: Atsushi Nakamura, Munich (DE)

(73) Assignee: Advantest Corporation, Tokyo (JP)

( * ) Notice: Subject to any disclaimer, the term of this patent is extended or adjusted under 35 U.S.C. 154(b) by 64 days.

(21) Appl. No.: 16/541,744

(22) Filed: Aug. 15, 2019

(65) Prior Publication Data

US 2019/0377016 A1    Dec. 12, 2019

Related U.S. Application Data

(63) Continuation of application No. PCT/EP2017/060138, filed on Apr. 27, 2017.

(51) Int. Cl.
*G01R 27/16*   (2006.01)
*G01R 31/40*   (2020.01)

(52) U.S. Cl.
CPC ............. *G01R 27/16* (2013.01); *G01R 31/40* (2013.01)

(58) Field of Classification Search
CPC ........ G01R 27/16; G01R 31/40; G01R 15/04; G01R 31/3191; G01R 35/005
See application file for complete search history.

(56) References Cited

U.S. PATENT DOCUMENTS

| | | | |
|---|---|---|---|
| 5,012,181 A | 4/1991 | Eccleston | |
| 5,177,447 A | 1/1993 | Marino et al. | |
| 6,504,395 B1 | 1/2003 | Johnson | |
| 9,806,605 B2 * | 10/2017 | Tsumura | H01L 27/0802 |
| 2011/0001501 A1 | 1/2011 | Walker | |
| 2011/0001502 A1 * | 1/2011 | Walker | G01R 17/02 |
| | | | 324/706 |
| 2015/0002139 A1 * | 1/2015 | Lu | G01R 19/0046 |
| | | | 324/156 |
| 2015/0023386 A1 * | 1/2015 | Sinha | G01K 7/16 |
| | | | 374/1 |
| 2015/0268369 A1 * | 9/2015 | Dodds | G01V 3/10 |
| | | | 324/334 |
| 2018/0299492 A1 * | 10/2018 | Maier | G01R 19/257 |

FOREIGN PATENT DOCUMENTS

| | | | | |
|---|---|---|---|---|
| EP | 0496147 | | 7/1992 | |
| EP | 0496147 A1 * | | 7/1992 | ........... G01R 35/005 |
| EP | 1440328 | | 7/2004 | |

* cited by examiner

*Primary Examiner* — Akm Zakaria

(57) ABSTRACT

A calibration arrangement for calibrating a power source includes first and second resistors with first and second resistances, respectively, which are usable in calibrating the power source. The second resistance is smaller than the first resistance and the calibration arrangement is configured to allow for a measurement of the first resistance of the first resistor. The calibration arrangement is configured to form a series connection of the first resistor and of the second resistor, to allow for at least two voltage measurements between at least two different pairs of circuit nodes of the series connection, wherein a same current is applied during the at least two voltage measurements, and to derive the second resistor with a second resistance on the basis of the at least two voltage measurements and a result of the measurement of the first resistance of the first resistor.

13 Claims, 5 Drawing Sheets

CALIBRATION ARRANGEMENT AND METHOD FOR DERIVING A RESISTANCE OF A RESISTOR

CROSS-REFERENCES TO RELATED APPLICATIONS

This application is a continuation of copending International Application No. PCT/EP2017/060138, filed Apr. 27, 2017, which is incorporated herein by reference in its entirety.

Embodiments of the present invention relate to calibrating circuits and methods for deriving of resistances.

BACKGROUND

Next generation high power devices such as smart power or automobile devices may use higher precision high current/voltage sources or power supplies for their accurate on resistance, current limiter or thermal resistance measurements. Current values which may be used for performing these tests are distributed from an ampere to 100A or more.

Conventionally, calibrating a current (e.g. provided to a device under test) or a measurement source circuit for a device under test involves (e.g. may use) voltage/current source or power supply calibration units including several reference voltages and resistors in which the value suit for each current range calibration of the voltage/current source r power supply. The reference voltages and resistors are typically calibrated using a national institute of standards and technology (NIST) compliant multimeter periodically. The voltage/current source or power supply current is driven through calibrated reference resistors of a calibration unit and the voltage across the reference resistor is measured by a voltmeter of the voltage/current source or power supply. A current value calculated from the measured voltage and the calibrated resistors resistance values is then compared with the current value determined by a current measurement circuitry which is internal to the voltage or current source or power supply (e.g. which defines a current to a device under test).

Conversely, the accuracy of the reference resistor calibration determines the accuracy of the current of the voltage/current source or power supply.

A common problem when calibrating low resistance resistors using a standard NIST compliant multimeter in resistance measurement mode is an increase of the resistance error when a resistance value is getting smaller. As a result an error of small reference resistors measured resistance values is a significant limitation in improving a current accuracy in conventional high current voltage or current source or power supplies.

Therefore, there exists a desire for an improved concept for deriving resistances of calibration arrangements.

SUMMARY

According to an embodiment, a calibration arrangement for calibrating a power source may have: a first resistor with a first resistance usable in a calibration of the power source; a second resistor with a second resistance usable in the calibration of the power source, wherein the second resistance is smaller than the first resistance; wherein the calibration arrangement is configured to allow for a measurement of the first resistance of the first resistor; and wherein the calibration arrangement is configured to form a series connection of the first resistor and of the second resistor; wherein the calibration arrangement is configured to allow for at least two voltage measurements between at least two different pairs of circuit nodes of the series connection, wherein a same current is applied during the at least two voltage measurements, wherein the calibration arrangement is configured to derive the second resistance of the second resistor on the basis of the at least two voltage measurements and a result of the measurement of the first resistance of the first resistor.

According to another embodiment, a tester for testing a device under test may have: a controlled power source, and an inventive calibration arrangement.

According to another embodiment, a method for deriving a resistance of a resistor of a calibration arrangement may have the steps of: measuring of a first resistance of a first resistor; and forming a series connection of the first resistor and a second resistor, wherein the second resistor has a second resistance, wherein the second resistance is smaller than the first resistance, measuring at least two voltages between at least two different pairs of circuit nodes of the series connection, when a same current is applied during the at least two voltage measurements, deriving the second resistance of the second resistor on the basis of the at least two measured voltages and a result of the measurement of the first resistance of the first resistor.

Another embodiment may have a computer program for performing the inventive method, wherein the computer program runs on a computer.

Embodiments of the invention provide a calibration arrangement for calibrating a power source. The calibration arrangement comprises a first resistor with a first resistance usable in a calibration of the power source and a second resistor with a second resistance usable in a calibration of the power source. The second resistance is smaller than the first resistance and the calibration arrangement is configured to allow for a measurement of the first resistance of the first resistor. Moreover, the calibration arrangement is configured to form a series connection of the first resistor and the second resistor. Further, the calibration arrangement is configured to allow for at least two voltage measurements between at least two different pairs of circuit nodes of the series connection, wherein a same current is applied during the at least two voltage measurements. The calibration arrangement is configured to derive the second resistance of the second resistor on the basis of the at least two voltage measurements and a result of the measurement of the first resistance of the first resistor.

The described calibration arrangement beneficially allows to series connect the first and the second resistor which is useful to perform voltage measurements. Moreover, by using voltage measurements, e.g. using a voltage measurement mode of a multimeter, a higher accuracy can be obtained than measuring the second resistance of the second resistor directly, e.g. using a resistance measurement mode of a multimeter. By using a constant current flowing through the first resistor and the second resistor a constant voltage drop is observed over the series connection of the first and the second resistor. The voltage drop can be divided and separate voltages across varying pairs of circuit nodes of the series connection can be used to obtain the at least two voltage measurements. Thereby, for example a ratio of voltages may be obtained which may be usable in determining a ratio of the resistances. Further, e.g. based on a ratio of the resistances and the measured resistance the second resistance may be derived. Moreover, measuring the first resistance with a resistance measurement is less prone to errors (e.g., a relative error may be small) as the first resistance is bigger than the second resistance. Concluding, deriving the second resistance based on the measurement of the first resistance and at least two voltage measurements while the resistors are circuited in series (which means that substantially identical currents flow through both resistors), allows to decrease an error when compared to directly measuring the second resistance of the second resistor in a resistance measurement mode of a multimeter, allowing for more precise calibration of a calibration arrangement, e.g. for current/voltage/power sources of automated test equipments.

In embodiments the at least two voltage measurements comprise a measurement of a first voltage drop over the first resistor and a measurement of a second voltage drop over the second resistor. Moreover, the calibration arrangement is configured to derive the second resistance based on the measurement of the first resistance and a ratio of the first voltage drop and the second voltage drop. Measuring the individual voltage drops over the first and the second resistor provides a direct access to a ratio of the first and the second resistance which when weighted by the first resistance may be used to obtain an estimate of the second resistance. The obtained estimate of the second resistance is in general more accurate than a direct measurement of the second resistance in a resistance measurement mode of a multimeter as its estimation uses voltage measurements.

In embodiments the at least two voltage measurements comprise a measurement of a first voltage drop over the first resistor and a measurement of a second voltage drop over the series connection of the first resistance and the second resistor. Further, the calibration arrangement is configured to derive the second resistance based on the measurement of the first resistance, the first voltage drop and the second voltage drop. The described embodiment may obtain a ratio of the first resistance to the second resistance by subtracting the first voltage drop from the second voltage drop and producing a ratio of the result of the subtraction and the first voltage drop. This ratio can then be used when weighted with the measurement of the first resistance to derive the second resistance. The derived second resistance has a higher accuracy than a direct measurement of the second resistance with a multimeter in resistance measurement mode as its estimation uses voltage measurements.

In embodiments the at least two voltage measurements comprise a measurement of a first voltage drop over the second resistor and a measurement of a second voltage drop over the series connection of the first resistor and the second resistor. Further, the calibration arrangement is configured to allow for a derivation of the second resistance based on the measurement of the first resistance, the first voltage drop and the second voltage drop. By subtracting the first voltage drop from the second voltage drop and dividing the subtraction with the first voltage drop a ratio of the first and the second resistor is obtained. The obtained ratio may be multiplied with the first resistance to provide an accurate estimation of the second resistance. The estimation of the second resistance is more accurate than directly measuring the second resistance with a multimeter in resistance measurement mode as its estimation uses voltage measurements.

In embodiments the first resistance of the first resistor is at least five times larger than the second resistance of the second resistor. Alternatively, the first resistance of the first resistor is at least ten times larger than the second resistance of the second resistor. Having a first resistor with a high resistance enables determination of the resistance of the first resistor with a resistance measurement mode of a multimeter with a high accuracy.

In embodiments the calibration arrangement is configured to allow for a 4 wire precision measurement of the first resistance of the first resistor. Using a 4 wire precision measurement allows to more precisely determine the resistance of the first resistor. In particular, for a 4 wire measurement, two wires are used to provide a current to the resistor and two wires are used for measuring a voltage drop over the resistor. Based on the knowledge of the provided current the resistance may be accurately determined. The two wires used for measuring the voltage are ideally connected to high impedance terminals of a measurement device. Thereby, only a contribution of the resistance of the resistor is effective in the voltage measurement neglecting the contributions of wires connected to the resistor.

In embodiments the second resistance of the second resistor is smaller than 1 Ohm. A resistance of smaller than 1 ohm may be usable to calibrate a current/voltage/power source configured to provide high currents. Moreover, the second resistance of the second resistor being smaller than 1 Ohm is especially suitable for measurement with a voltage measurement mode of a multimeter as in resistance measurement mode conventional multimeters produce inaccurate results. The described voltage measurement is advantageously performed using the series connection of the first resistor and the second resistor avoiding the use of a multimeter in resistance measurement mode. In particular, precision of resistance measurement modes of a multimeter is low for small resistors, e.g., smaller than 1 Ohm.

In embodiments the calibration arrangement comprises a current source, wherein the calibration arrangement is configured to circuit the current source in series with a first resistor and the second resistor while the at least two voltage measurements are performed. Further, the current source is configured to provide identical currents during the at least two voltage measurements. A current provided to the first resistor and the second resistor may advantageously be chosen such that a voltage drop of the second resistor is greater than or equal to 0.1 V. Using the described current source having a constant current during the at least two voltage measurements, a first and a second voltage drop can be determined and may either be set directly into relation or derived values may be set into relation. Based on the relation the calibration arrangement may facilitate easy derivation of the second resistance of the second resistor.

In embodiments the calibration arrangement comprises switches, wherein the switches are configured to connect the first resistor and the second resistor (e.g., between force lines) in a first switch state such that a resistance of the series connection is effective (e.g., for obtaining the at least two voltage measurements). Alternatively, the switches are configured to allow for a connection of the first resistor such that the first resistance of the first resistor is effective in a second switch state. For example, to allow for calibration of a first current range of a current/voltage/power source connected to the calibration arrangement. Further, the switches are configured to allow for connection of the second resistor such that the second resistance of the second resistor is effective in a third switch state. For example, to allow for calibration of a second current range of a current/voltage/power source connected to the calibration arrangement, wherein the second current range comprises higher currents than the first current range. The described embodiment is especially beneficial as it flexibly enables contacting various effective resistances which may be used for calibrating a voltage/current/power supply/source.

In embodiments a first switch is arranged between a first terminal of the first resistor and a first supply line, a second switch is arranged between the first terminal of the first resistor and a first sense line, a third switch is arranged between a first terminal of the second resistor and the first supply line, a fourth switch is arranged between the first terminal of the second resistor and the first sense line, a fifth switch is arranged between a second terminal of the first resistor and a second supply line, a sixth switch is arranged between the second terminal of the first resistor and a second sense line, a seventh switch is arranged between a second terminal of the second resistor and the second sense line. Further, in the first switch state the first switch, the second switch and the seventh switch are closed and in the second switch state the first switch, the second switch, the fifth switch and the sixth switch are closed. Moreover, in the third switch state the third switch, the fourth switch and the seventh switch are closed. The described embodiment enables simple contacting of effective resistances (e.g., the first resistance, the second resistance or a resistance based on the series connection of the first and the second resistor) using switches. Moreover, by using force lines and sense lines, one pair of lines (e.g., the force lines) can be used to provide a current to the resistor (e.g., from a power source of an ATE) and another pair of lines (e.g., the sense lines) may be used to measure a voltage drop over an effective resistance. The switches might be relays, transistors or any other electric switching devices.

In embodiments the calibration arrangement is configured to allow for a 4 wire connection of the first resistor and the second resistor with a power source. The connection may be such that the first resistor is switchable as a load of the power source when sense terminals of the first resistor are coupled to sense lines of the power source and such that the second resistor is switchable as a load of the power source when sense terminals of the second resistor are coupled to sense lines of the power source. Thereby, the calibration arrangement allows for high precision voltage measurement over the resistors in the calibration arrangement. In particular, the resistances of the calibration arrangement may be used to adjust a voltage drop of an on resistor of a power source. Thereby, the power source may provide a defined current or a current range to a device under test.

In embodiments a calibration arrangement is configured to connect the first resistor to the power source for calibrating a first current range of the power source. Further, the calibration arrangement is configured to connect the second resistor to the power source for calibrating a second current range of the power source. Moreover, the first current range comprises smaller currents than the second current range. The described embodiment is especially useful for calibrating a resistance of a power source, wherein the resistance is used to define a current or a current range of the power source. For example, for automatic test equipment power sources with accurate output currents may be needed which benefit from an accurately determined on resistance using the calibration arrangement.

In embodiments the calibration arrangement comprises a reference voltage source usable for calibration of a voltmeter of a power source. The reference voltage source in the calibration arrangement is useful for adjusting a voltage measurement circuit in a power source (voltage/current source) such that the voltage measurement circuit may accurately measure voltages over the first resistor or the second resistor. Thereby, biases which may be due to connecting wires can be compensated.

In embodiments the calibration arrangement comprises a memory unit configured to store reference values, wherein the reference values comprise a result of the resistance measurement of the first resistor and the derived second resistance of the second resistor. Having a calibration arrangement with a memory unit saves the need for having an external computer or other storage device for keeping the derived resistance values such that a power source connected to the calibration arrangement may directly use the reference values from the memory unit included in the calibration arrangement. However, the calibration arrangement may also comprise some electronic device (e.g., a computer) attached to it which provides for a memory unit to store the reference values.

Embodiments of the invention provide for a tester for testing a device under test, wherein the tester comprises a controlled power source and a calibration arrangement (as described herein). The described tester can, based on a calibration using the calibration arrangement comprising resistors with accurately determined resistance values, provide accurate currents to a device under test. Therefore, the described tester can perform a more sophisticated (e.g., high quality) testing of devices under test.

Embodiments provide for a method for deriving a resistance of a resistor of a calibration arrangement. The method comprises measuring of a first resistance of a first resistor and forming a series connection of the first resistor and a second resistor, wherein the second resistor has a second resistance and wherein the second resistance is smaller than the first resistance of the first resistor. Further, the method comprises measuring at least two voltages between at least two different pairs of circuit nodes of the series connection when a same current is applied during the at least two voltage measurements. Moreover, the method comprises deriving the second resistance of the second resistor on the basis of the at least two measured voltages and a result of the measurement of the first resistance of the first resistor. The method can be supplemented by all features and functionalities described herein with respect to the apparatus.

BRIEF DESCRIPTION OF THE DRAWINGS

Embodiments of the present invention will be detailed subsequently referring to the appended drawings, in which.

DETAILED DESCRIPTION OF THE INVENTION

The invention will be understood more fully from the detailed description given below and from the accompanying drawing of embodiments of the invention which, however should not be taken to limit the invention to the specific embodiments described, but are for explanation and understanding only.

Figure 1:
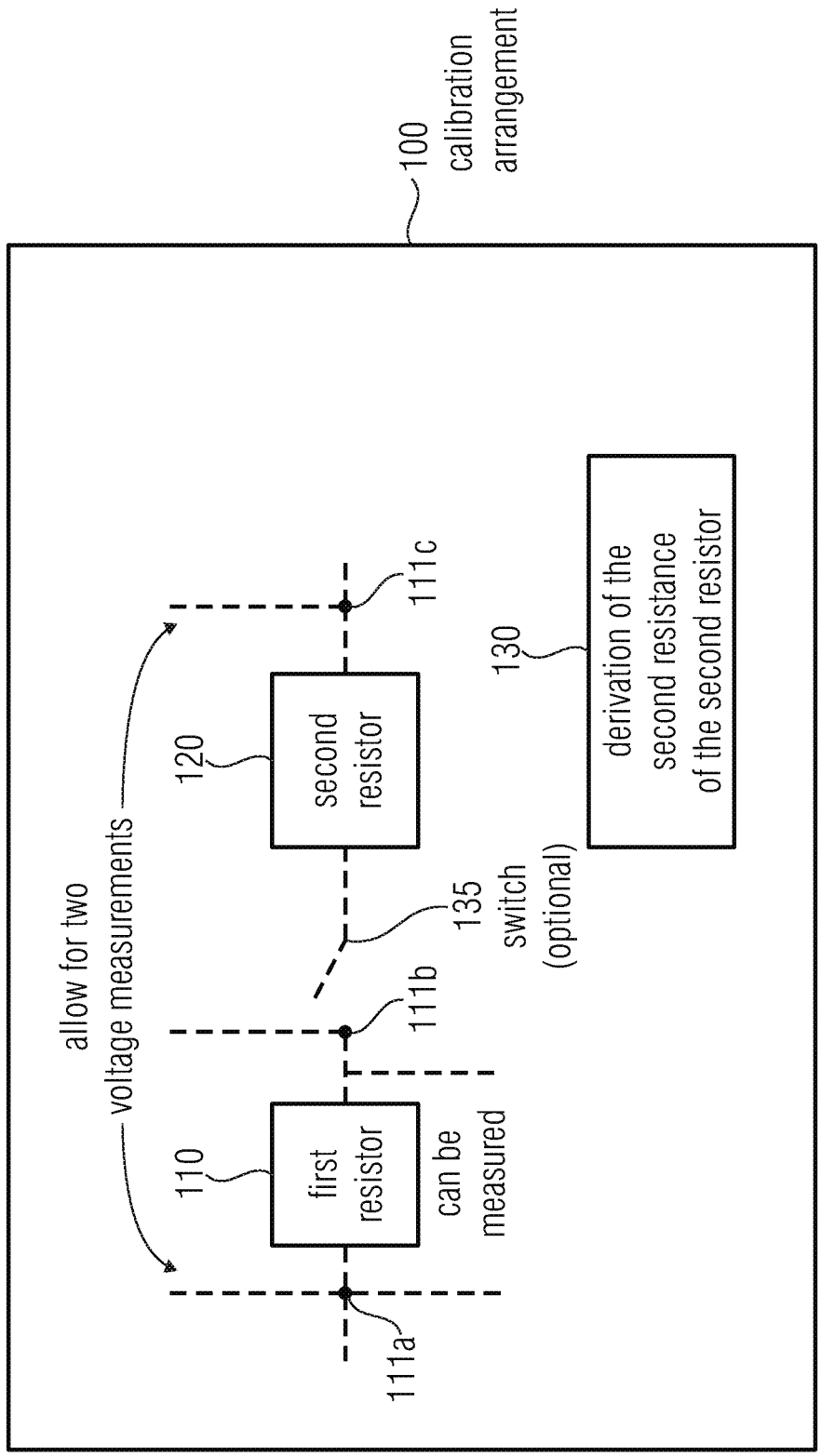
FIG. 1 shows a block diagram of a calibration arrangement according to embodiments of the invention.

FIG. 1 shows a block diagram of a calibration arrangement 100 according to embodiments of the invention. The calibration arrangement 100 comprises a first resistor 110, a second resistor 120, optionally a switch 135 and a deriver 130.

The calibration arrangement 100 enables to form a circuit connection between the first resistor 110 and the second resistor 120 in series by closing switch 135. Moreover, the calibrations arrangement allows to flexibly measure the at least two voltages between any pair of the circuit nodes 111a, 111b or 111c, whereby, at least three different voltages are obtainable (wherein in some embodiments, two of the voltages are used). Moreover, the calibration arrangement 100 is configured to allow for a measurement of the first resistance of the first resistor, e.g., using circuit node 111a and circuit node 111b. As a voltage measurement can be performed with conventional multimeters more precisely than a resistance measurement, the resistance of the second resistor 120 can be determined more precisely using the calibration arrangement 100. For example, when the first resistance of the first resistor 110 is larger than the second resistance of the second resistor 120 an error of a measurement of the first resistance is relatively small. However, when the second resistor 120 has a smaller resistance than the first resistor 110 an error of the resistance measurement of the second resistor would be relatively larger than for the first resistor 110. Therefore, using voltage measurements the second resistance can be derived more accurately than by directly measuring the second resistance, e.g. using a multimeter in resistance measurement mode. Accordingly, the deriver 130 is configured to derive the second resistance of the second resistor based on the measured resistance of the first resistor 110 and at least two voltage measurements. The at least two voltage measurements can be based on arbitrary pairs of circuit nodes 111a-c of the calibration arrangement 100. For example, a first voltage drop may be measured over the first resistor 110 and a second voltage drop may be measured over the second resistor 120. Further, the second voltage drop may also be a voltage drop of the series connection of the first resistor 110 and the second resistor 120. Furthermore, the first voltage drop may also be measured over the second resistor 120. A ratio may be formed using the voltage measurements which in combination with the measured resistance of the first resistor 110 can then be used to obtain an accurate estimation of the second resistance of the second resistor 120. To conclude, using the calibration arrangement 100, for example for calibrating a power source of an automatic test equipment or, a more precise adjustment of a current or a voltage of the automatic test equipment can be achieved.

In the following aspects of embodiments of the invention are described which can be used by themselves or in combination with any of the embodiments described herein. In other words, the embodiments described herein ca be supplemented by any of the features and functionalities described in the following, either individually or in combination.

Figure 2:
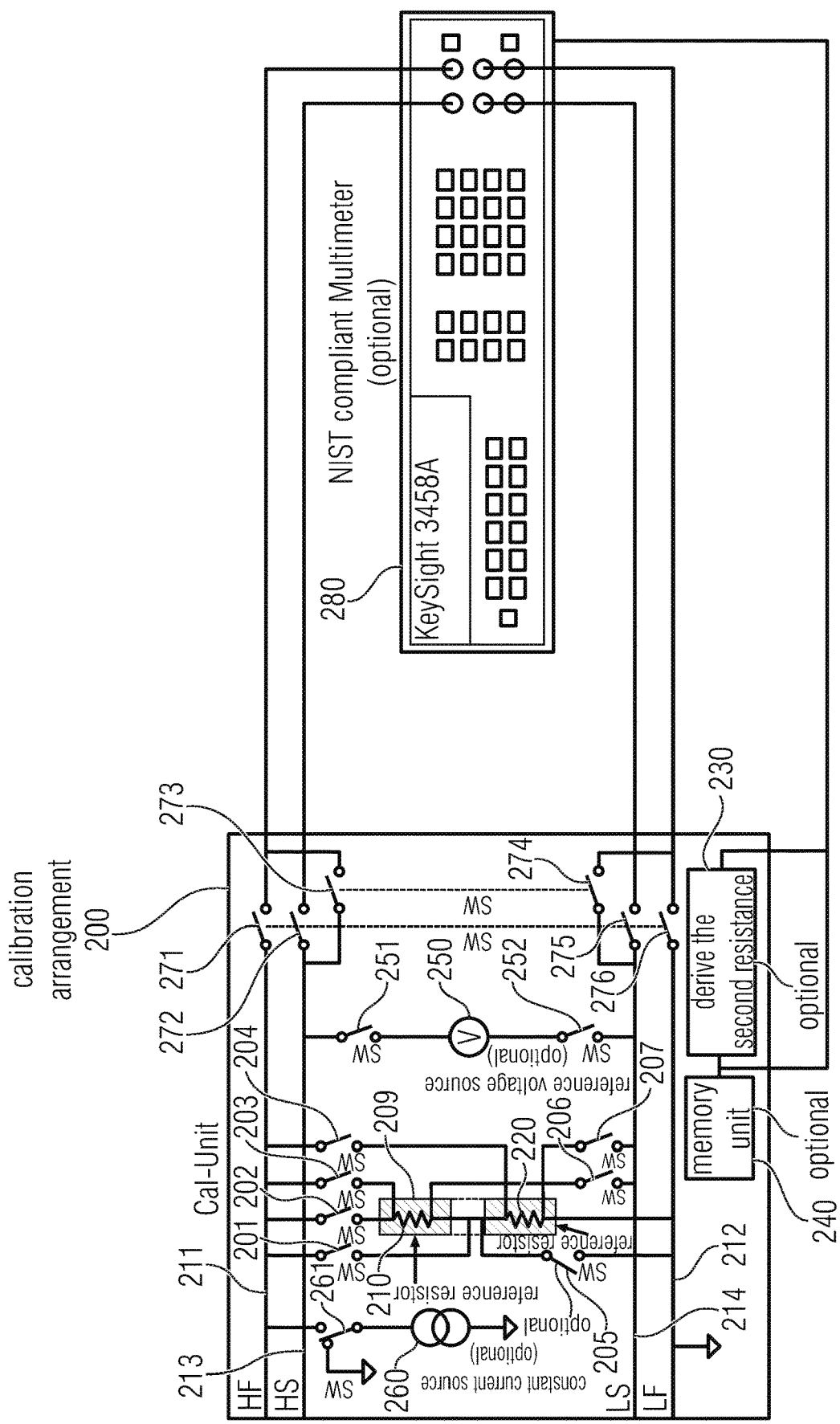
FIG. 2 shows a schematic diagram of a calibration arrangement according to embodiments of the invention.

FIG. 2 shows a schematic diagram of a calibration arrangement 200 according to embodiments of the invention. In other words, FIG. 2 shows a diagram of an embodiment of an inventive calibration unit 200 with a NIST compliant Multimeter 280. The calibration arrangement 200 comprises a first resistor 210 and a second resistor 220. The first and the second resistors are also labelled reference resistors as they might be used as reference resistors in a calibration process, e.g. of a current/voltage/power source of an automated test equipment. Moreover, the calibration arrangement 200 comprises a deriver 230 for deriving the second resistance (which may be arranged at different locations within a system, but which is logically associated with the cal unit 200), an optional memory unit 240, an optional reference voltage source 250 and an optional constant current source 260. Further, the calibration arrangement 200 comprises switches 201 to 207 which allow for a series connection of the first resistor 210 and the second resistor 220 or to individually contact the first resistor 210 or the second resistor 220. Furthermore, the calibration arrangement 200 comprises an optional switch 261 for coupling or decoupling of the optional constant current source 260 between the force lines (HF, LF). Moreover, the calibration arrangement 200 may comprise switches 251 and 252 to couple or decouple the reference voltage source 250 with or from the switches 213, 214. Moreover, the calibration arrangement 200 comprises switches 271 to 276 which enable to perform resistance measurements or voltage measurements over the first resistor 210 or the second resistor 220. Further, an optional NIST compliant multimeter 280 is connected via four wires to the calibration arrangement 200 (for example, to the force lines (HF, LF) and the sense lines (HS, LS)).

The calibration arrangement 200 is configured to allow for four wire measurement of voltages and resistances in the calibration arrangement 200 using high force line 211, low force line 212, high sense line 213 and low sense line 214. In an advantageous embodiment the calibration arrangement 200 would close switches 202, 203, 205, 206, 271, 272, 275 and 276. In this state the first resistor 210 is connected to the NIST compliant multimeter 280 via four wires. Thereby, a high precision resistance measurement of the first resistor 210 can be obtained. Optionally, the resistance measurement of the first resistor 210 can also be performed while switch 205 is open, as using a four wire measurement of the resistance of the first resistor 210 is based on a voltage drop over the first resistor 210 only, via switches 206 and 203. In other words, a known current may be injected into the series connection 209 and based only on the voltage drop over the first resistor 210 the resistance of the first resistor 210 is determined by multimeter 280. The obtained first resistance value of the first resistor 210 can then be stored, for example, in a memory unit 240. In a further step, at least two voltage drops are measured between at least two different pairs of circuit nodes of the series connection of the first resistor 210 and the second resistor 220. To this end, switches 273 and 274 are closed such that the NIST compliant multimeter 280 can be used in voltage measurement mode and the appropriate switches of the switches 201-207 are closed and opened, respectively, to flexibly determine at least two voltage drops over a series connection 209 of the first resistor 210 and the second resistor 220. A constant current is provided to the series connection 209 during the at least two measurements, e.g., by constant current source 260 (wherein switch 261 couples the constant current source to the high force line 211 when it is closed). The obtained voltage measurements are then provided to the deriver 230 which derives the second resistance and, for example, provides it to the memory unit 240 for storage. After the calibration (i.e. obtaining the first resistance value and the second resistance value) of the calibration arrangement 200 the force and sense lines 211-214 are connected to a power source to be calibrated. Therefore, to compensate biases caused, e.g., by connecting wires, an internal voltage measurement unit of the power source may be calibrated using reference voltage source 250. In a further step, a voltage drop over the first resistor or the second resistor is measured by the current/voltage/power source. Based on the obtained voltage measurement and the previously acquired high precision knowledge about the resistance value of the first resistor 210 or the second resistor 220, a current measurement using a shunt resistor of the power supply (or one of multiple possible shunt resistors) is calibrated.

Figure 3:
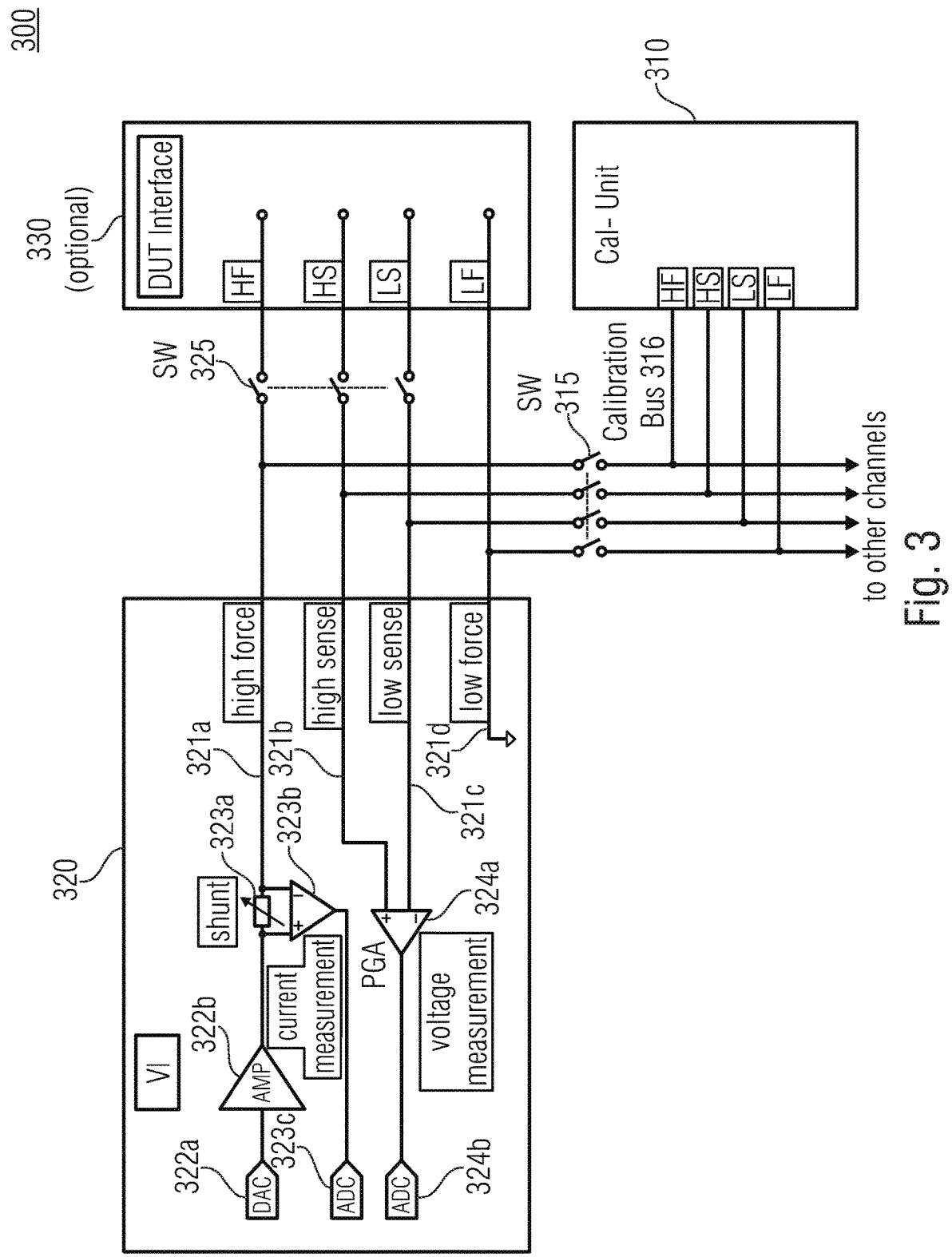
FIG. 3 shows a block diagram of a tester according to embodiments of the invention.

FIG. 3 shows a block diagram of a tester 300 according to embodiments of the invention. In other words, FIG. 3 shows a block diagram of an ATE high current VI source 320 including DUT connection 320 and calibration unit 310. The tester, also referred to as automated test equipment (ATE), comprises a voltage/current (VI) source 320 (power supply), a calibration unit 310, e.g., the calibration arrangement 100 or the calibration arrangement 200, and a device under test interface 330. Moreover, the tester 300 comprises switches 315 configured to connect the calibration arrangement 310 to the power supply 320 and switches 325 configured to connect the DUT interface 330 to the power supply 320.

The power supply 320 comprises four signal lines 321a-d to connect the power supply to either the device under test via the device under test interface 330 and via switches 325 or to the calibration arrangement 310 via switches 315. Signal lines 321a and 321d are high force and low force lines, respectively, which are configured to provide a current to a device under test, wherein the high force line 321a provides a current flowing into a device under test (e.g., having a positive voltage) and a low force line 321d receives the current returning from the device under test (e.g., having a lower voltage than the high force line 321a). The high sense line 321b and the low sense line 321c are in optimal conditions without a current flowing and are, therefore, usable for a voltage measurement of a device under test without affecting the device under test or for regulating a voltage provided to the device under test. The power source 320 comprises a controlled source 322b which obtains a control signal from a digital to analog converter 322a to adjust a provided voltage by the controlled source 322b. Between the controlled source 322b and the high force line 321a a shunt 323a (e.g., a measurement shunt) is circuited which can be adjusted. In parallel to the shunt 323a a voltage measurement unit 323b is circuited. Based on a measured voltage across the measurement shunt 323a a current is derived based on a knowledge of resistance value of the measurement shunt 323a via the analog to digital converter 323c (when said knowledge is obtained in a calibration). The knowledge of the resistance value is based on a calibration using the calibration arrangement 310. Thereby, a current provided to the device under test can be measured accurately or a defined current can be provided to a device under test, for example, via the device under test interface 330. Using the high sense line 321b and the low sense line 321c a voltage of the device under test is provided to a programmable gain amplifier (PGA) 324a which provides an analog voltage signal which is converted into a digital signal by analog to digital converter 324b. Thereby, a voltage can be measured at a device under test connected to the device under test interface 320. Moreover, the voltage measurement based on the programmable gain amplifier 324a and the analog to digital converter 324b can also be used in a calibration process using calibration arrangement 310.

Figure 4:
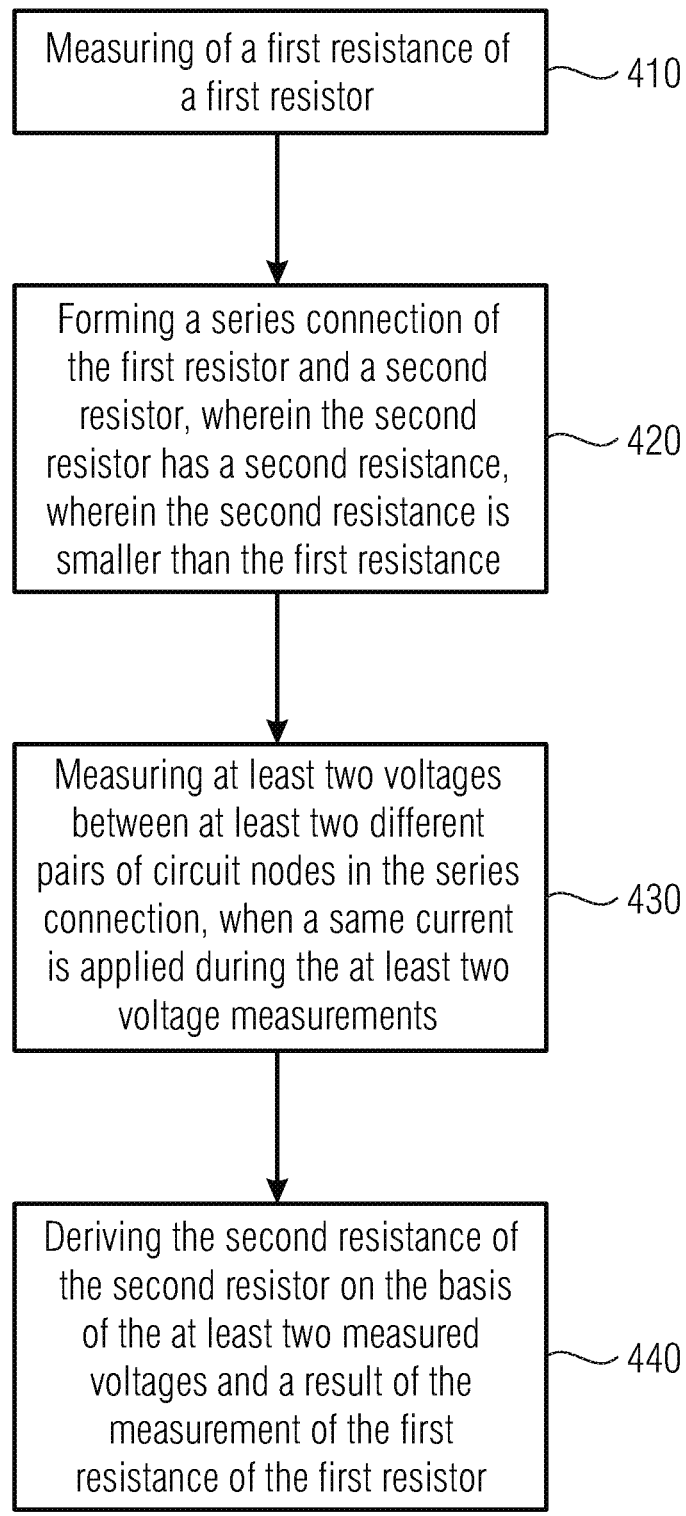
FIG. 4 shows a flow chart of a method according to embodiments of the invention.

FIG. 4 shows a flow chart of a method 400 according to embodiments of the invention. The method comprises measuring 410 of a first resistance of a first resistor and forming 420 a series connection of the first resistor and a second resistor, wherein the second resistor has a second resistance, wherein the second resistance is smaller than the first resistance. Further, the method 400 comprises measuring 430 at least two voltages between at least two different pairs of circuits nodes in the series connection when the same current is applied during the at least two voltage measurements. The method 400 further comprises deriving 440 the second resistance of the second resistor on the basis of the at least two measured voltages and a result of the measurement of the first resistance of the first resistor.

Figure 5:
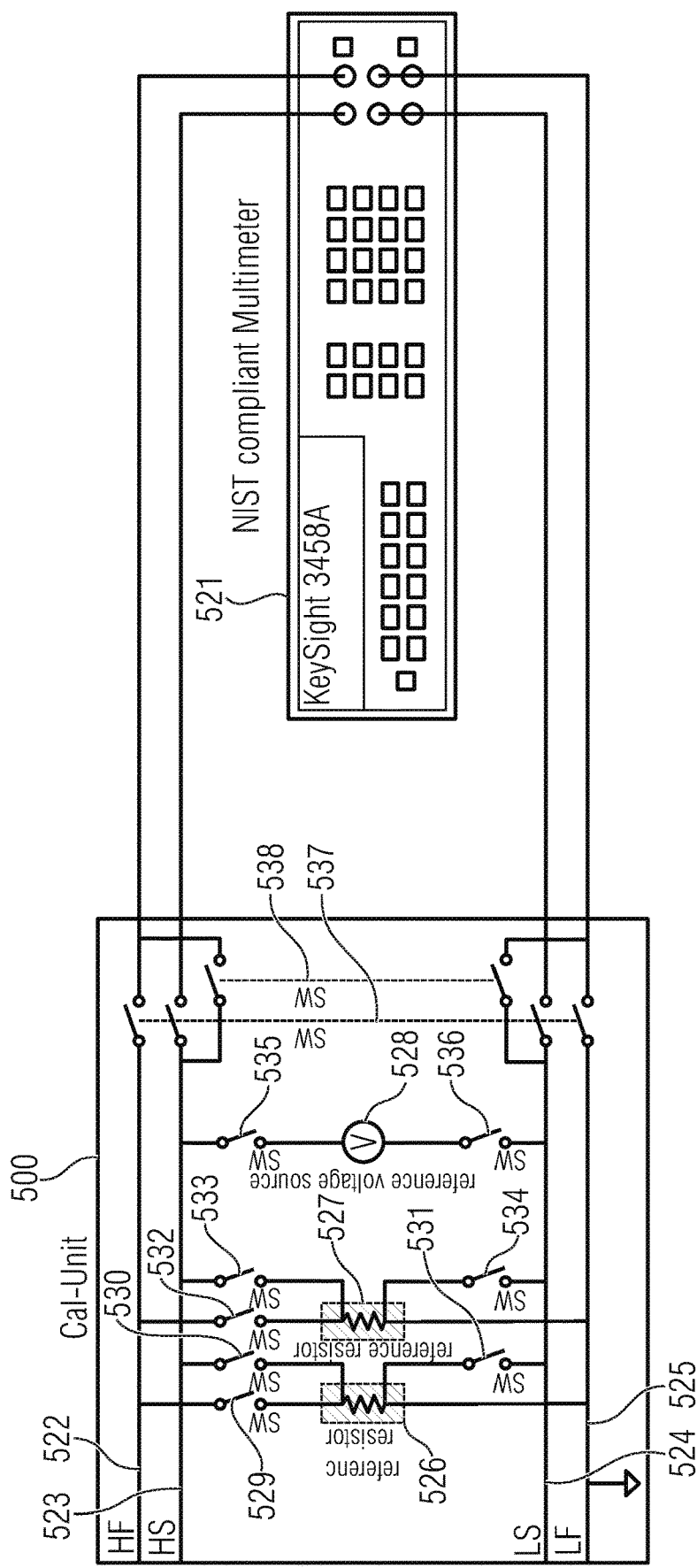
FIG. 5 shows a schematic diagram of a conventional calibration arrangement in connection with a multimeter.

FIG. 5 shows diagram of a conventional calibration unit with a NIST compliant Multimeter.

Further Aspects

Embodiments describe a Method and apparatus for calibration of a precision high current VI (voltage/current) source.

Embodiments of the present invention relate generally to automated device testing and to improving measurement/source accuracy for high current equipment used for automated device testing.

Next generation high power devices such as Smart Power or Automobile devices may use higher precision high current/voltage (VI) source or power supply for its accurate On Resistance (Rdson) measurements, Current Limiter measurements or Thermal Resistance (Rth) measurements. The current value which may be used for performing these tests are distributed from an ampere to 100A or more.

According to embodiments calibrating the current measurement/source circuit for a DUT VI source or power supply involves that the calibration unit comprises several reference voltages and resistors the values of which suit for each current range calibration of the power supply or VI sources. These reference voltages and resistors are typically calibrated using NIST compliant Multimeters periodically. For example, when calibrating the current measurement of the device under test VI source or power supply, a VI source or power supply current is driven through a calibration unit's calibrated reference resistor and the voltage across the reference resistor is measured by a voltmeter of the VI source or power supply. The current value calculated from the measured voltage and the calibrated resistors is then compared with the current value determined by the current measurement circuitry internal to the VI source or power supply.

Conversely, the accuracy of the reference resistor calibration determines the accuracy of a current of a VI source or power supply.

The described reference resistors (e.g., Resistors 110, 120, 210 and 220) are usually selected in terms of the current range that may be used and have a low temperature coefficient preventing them from drift caused by self-heating. In addition, a 4 terminal resistor may be selected for low resistance resistors to reduce the sources of errors. Usually several hundred milliohm reference resistor may be used when a high current range, e.g., several amperes, is used.

A common problem for calibrating low resistance resistors using standard NIST compliant Multimeters in resistance measurement mode is an increase of the resistance error for decreasing resistance values. As a result, an error of a low resistance reference resistor is a significant limitation in improving a current accuracy of high current VI sources or power supplies.

Accordingly, it has been found that there is a need for an accurate calibration process for low reference resistor in the calibration unit for high current VI source or power supply.

FIG. 3 is an example block diagram of an ATE VI source 320 with DUT interface 330 and Cal-Unit 310 (e.g., calibration arrangement 100 or 200). VI source 320 can be connected to DUT when SW 325 is closed and deliver voltage/current to the DUT. VI source 320 can also be connected to Cal-Unit 310 via Calibration Bus 316 when SW 315 is connected during the calibration of the VI source 320. Usually Calibration Bus 316 consists of High Force, High Sense, Low Force and Low Sense line to allow for Kelvin connection to the Reference Voltages or Resistors. FIG. 3 display only one VI source channel but usual ATE VI source or power supply modules have multiple channels in it. Therefore, normally Cal-Unit 310 is a common resource for multiple channels. Each channel can connect to Cal-Unit 310 independently.

FIG. 5 shows a diagram illustrating an example of a conventional Cal-Unit 500 which consists of Reference Voltages 528 and Reference Resistor 526, 527. An external NIST compliant Multimeter 521 is connected to Cal-Unit 500 for calibration of the Cal-Unit 500.

A conventional process of calibrating the current of ATE VI source or power supply 320 is: First Cal-Unit 500 Reference Voltages 528 and Reference Resistor 526, 527 are periodically calibrated by NIST compliant Multimeter 521. The period of the calibration is dependent on the requirement of the VI source or power supply specification but normally 3 Month to 6 Month periods. Measured Reference Voltages and Resistance value are normally stored in the Non-volatile memory in the module. This process is also called NIST trace calibration.

For calibration of a power supply in an ATE, a Voltage Measurement circuit (e.g. comprising ADC 324b and PGA 324a) of the voltage/current source (VI) is calibrated by connecting SW 517, SW 535, SW 536 and by applying the Reference Voltage 528 to Voltage Measurement circuit (e.g. comprising ADC 324b and PGA 324a). The gain and offset are calibrated by referencing Reference Voltage 528 for each voltage range and normally stored in a calibration file, for example, in a control computer. Finally VI 320 is set to force current mode and SW517, SW 529, SW530 and SW531 or SW517, SW 532, SW533 and SW534 are connected depend on the VI 320 current range where a selectable Shunt 323a value is set by the current range. VI 320 is set to force intended current into the Reference Resistor 526 or 527. The voltage across Reference Resistor 526 or 527 is measured by the Voltage Measurement circuit (e.g. comprising ADC 324b and PGA 324a) and the current into Reference Resistor 526 or 527 is calculated by calibrated Reference Resistor 526 or 527 value and calibrated Voltage Measurement circuit voltage by Ohm's law. Then a calculated current is compared to the Current Measurement circuit (e.g. comprising ADC 323c and amplifier 323b) which measures the voltage across the Shunt resistor 323a and then converts the measured voltage to digital data by ADC 323c and the current gain and offset of the Current Measurement circuit is determined and stored in the calibration file. This procedure is repeated for each current range by selecting the Shunt resistor 323a and Reference Resistors. The current gain and offset is applied for both current measure and current force mode of the VI 320. This process is called as Module Calibration or System Calibration and the period is also dependent on the requirement of the VI source or power supply specification but normally a day to 2 weeks periods.

From a series of description, one of the key component to determine accuracy of the VI source or power supply 320 is accuracy of the Reference Resistor calibration. As described above, calibrating low resistance resistor using a standard NIST compliant Multimeter resistance measurement has an increased resistance error when resistance value is getting smaller. To understand this issue more clearly, a specific example case is described below.

Assume that: NIST compliant Multimeter 521 is KeySight 3458A (former Agilent 3458A) which is one of the worldwide standard NIST compliant Multimeter. Reference Resistor 526 is used for 0.3A range of VI 320 and has high resistance value of 5 Ohm. Reference Resistor 527 is used for 3A and 10A range and has low resistance value of 0.2 Ohm.

TABLE 1

| Range | Accuracy (ppm of Reading + ppm of Range) | | | |
| --- | --- | --- | --- | --- |
|  | 24 Hour | 90 Day | 1 Year | 2 Year |
| 10 Ohm | 5 + 3 | 15 + 5 | 15 + 5 | 20 + 10 |

Table 1 is the specification of the Four-wire Ohms measurement of KeySight 3458A at 10 Ohm range. The minimum range of KeySight 3458A is 10 Ohm so for both Reference Resistor 526 and 527 this range and specification is used. Assume that KeySight 3458A calibration period is 1 Year, the expected measurement error of the Reference Resistor 526 $Error_{RR526}$ and 527 $Error_{RR527}$ can be described below.

$$Error_{RR526}=5\times15\times10^{-6}+10\times5\times10^{-6}=0.000125 \text{ (Ohm)} \qquad (1)$$

$$Error_{RR527}=0.2\times15\times10^{-6}+10\times5\times10^{-6}=0.000053 \text{ (Ohm)} \qquad (2)$$

The calculated measurement accuracy in percent of both Reference Resistor 526 $Accuracy_{RR526}$ and 527 $Accuracy_{RR527}$ are:

$$Accuracy_{RR526}=0.000125/5*100=0.0025(\%) \qquad (3)$$

$$Accuracy_{RR527}=0.000053/0.2*100=0.0265(\%) \qquad (4)$$

From calculated measurement accuracy (3) and (4), Accuracy (relative error) of the 0.2 Ohm Reference Resistor is 10 time lower than the accuracy of the 5 Ohm Reference Resistor. From the ATE module design sum of the rule, Reference Resistor accuracy should be at least 4 times better than its current accuracy specification of that range. From this rule, the current range specification using 0.2 Ohm Reference Resistor cannot be better than 0.106% at 3A and 10A range instead of the 0.01% of the 0.3A range when using the 5 Ohm Reference Resistor.

FIG. 2 illustrates a diagram of a Cal-Unit 200 according to embodiments of the invention. The Cal-Unit 200 comprises Reference Voltages 250, Reference Resistors 210, 220 and Constant Current Source 260. An external NIST compliant Multimeter 280 is connected to Cal-Unit 200 when calibrating the Cal-Unit 200. A difference between conventional Cal-Unit 500 and invented Cal-Unit 200 is: Reference Resistors 210 and 220 can be connected in series and the Constant Current Source 260 is added.

For comparison between conventional Cal-Unit 500 and invented Cal-Unit 200, assume that Cal-Unit 200 has: NIST compliant Multimeter 280, for example of type KeySight 3458A and its calibration period is 1 Year. Reference Resistor 210 has a high resistance value of 5 Ohm. Reference Resistor 220 has a low resistance value of 0.2 Ohm.

Embodiments describe a calibration method which comprises: measure Reference Resistor 210 with NIST compliant Multimeter 280 Four-wire Ohms measurement mode by closing SW 202, SW 203, SW 206, SW 205, SW 271, SW 272, SW 275 and SW 276. As already described above, the closing of switch SW 205 is optional, due to the four wire measurement. Since the measurement condition is the same as Cal-Unit 500, the expected measurement error of the Reference Resistor 210 $Error_{RR210}$ and accuracy in percent of Reference Resistor 210 $Accuracy_{RR210}$ can be described as below.

$$\text{Error}_{RR210} = 5 \times 15 \times 10^{-6} + 10 \times 5 \times 10^{-6} = 0.000125 \text{ (Ohm)} \quad (5)$$

$$\text{Accuracy}_{RR210} = 0.000125/5 \times 100 = 0.0025(\%) \quad (6)$$

Then SW 202, SW 203, SW 206, SW 273, SW 274 and SW 261 are closed. In this switch state, Constant Current Source 260 is connected to the Reference Resistors 210 and 220 via HF line 211. Assuming that a constant current $I_{CC260}$ is provided by the constant current source 260, the Resistance value of the Reference Resistor 210 is $R_{RR210}$ and the voltage across the Reference Resistor 210 is $V_{RR210}$ which can be measured by voltage measurement between HS 213 and LS 214 lines with the NIST compliant Multimeter 280 in voltage measurement mode. From Ohm's law, $V_{RR210}$ can be described below.

$$V_{RR210} = I_{CC260} \times R_{RR210} \quad (7)$$

Finally SW 202, SW 204, SW 207, SW 273, SW 274 and SW 261 are closed. With this switch state, Constant Current Source 260 is still connected to Reference Resistors 210 and 220 via HF line 211. Assume the Resistance value of the Reference Resistor 220 is $R_{RR220}$ and the voltage across the Reference Resistor 220 is $V_{RR220}$ which can also be measured by voltage measurement between HS 213 and LS 214 lines by NIST compliant Multimeter 280 in voltage measurement mode. From Ohm's law, $V_{RR220}$ can be described below.

$$V_{RR220} = I_{CC260} \times R_{RR220} \quad (8)$$

From the equation (7) and (8), following relation can be obtained.

$$R_{RR220} = R_{RR210} \times (V_{RR220}/V_{RR210}) \quad (9)$$

This equation (9) explains that the Resistance $R_{RR220}$ of the Reference resistor 220 value can be obtained from Reference resistance value $V_{RR210}$ of Resistor 210 and the voltages across both resistors which is generated by constant current $I_{CC260}$. Assume that $I_{CC260}$ current value is 150 mA so $V_{RR210}$ is expected to be 0.75V and $V_{RR220}$ is expected to be 0.03V. In case both voltage measurement can uses the same measurement voltage range of 1V, the voltage measurement accuracy is listed in Table 2.

TABLE 2

| Range | Accuracy with Option 002 (ppm of Reading + ppm of Range) | | | |
|---|---|---|---|---|
| | 24 Hour | 90 Day | 1 Year | 2 Year |
| 1 V | 1.5 + 0.3 | 3.1 + 0.3 | 4 + 0.3 | 10 + 0.3 |

Since, $V_{RR220}/V_{RR210}$ is a ratio of voltage measurements, the gain error of NIST compliant Multimeter can be ignored. The maximum expected error of Reference Resistor 220 can be calculated from following equation.

$$\text{Error}_{RR220} = (5 + (5 \times 15 \times 10^{-6} + 10 \times 5 \times 10^{-6})) \times ((0.03 + (0.03 \times 4 \times 10^{-6} + 1 \times 0.3 \times 106))/0.75) - 0.2 = 0.0000078 \quad (10)$$

$$\text{Accuracy}_{RR220} = 0.0000078/0.2 \times 100 = 0.0039(\%) \quad (11)$$

It is understandable that $\text{Accuracy}_{RR220}$ is 6.8 times better than the conventional Cal-Unit 500 Reference Resistor 527 accuracy $\text{Accuracy}_{RR527}$ of 0.0265%. Also from the ATE design sum of the rule, high current range such as 3A and 10A range accuracy can be improved to 0.0039%×4=0.0156% from the reference resistor point of view.

Note that the Constant Current 260 from equation (7), (8) and (9), does not require absolute accuracy. However, following characteristics are useful for improved results.

1. Current should be stable and no drift during the two voltage measurement.
2. Low current noise which should not disturb voltage measurement.
3. Current should be large enough to generate voltages to both resistors which can be reasonably measured by an NIST compliant Multimeter.
4. Current should be low enough not to cause self-heating of both resistors which causes drift of the resistance value.
5. To avoid warm up drift of the constant current circuit, the output should be connected to ground or dummy resistor when not used for the calibration.

Although the present invention has been fully described in connection with embodiments thereof with reference to the accompanying drawings, it is to be noted that various changes and modifications will become apparent to those skilled in the art. Such changes and modifications are to be understood as being included within the scope of the present invention as defined by the appended claims.

Several aspects of the invention, which can be used individually or in combination with the above mentioned embodiments, will be briefly summarized, in enumerated form:

1. A current calibration method, comprises: calibrating the high current VI source or power supply using the calibration unit.
2. The current calibration method according to aspect 1, wherein the calibration unit comprises a reference resistors and the constant current source.
3. The current calibrating method according to aspect 1, wherein measuring the higher reference resistor using an external National Institute for Standards Traceability (NIST) compliant Multimeter in 4 wire resistor measurement mode.
4. The current calibrating method according to aspect 1, wherein connecting higher reference resistor and lower reference resistor in series.
5. The current calibrating method according to aspect 1, wherein applying constant current to reference resistors from constant current source.
6. The current calibrating method according to aspect 1, wherein measuring the voltages across the both reference resistors using an external NIST compliant Multimeter in voltage measurement mode.
7. The current calibrating method according to aspect 1, wherein determine the lower reference resistor value from higher reference resistor value and ratio of both voltages.

CONCLUSION

In the following a brief summary of aspects of embodiments will be provided. An automated test equipment (ATE) calibration method and apparatus to calibrate precision high current device under test (DUT) voltage/current (VI) source or power supply is presented. The method comprises calibrating the high current VI source or power supply using the calibration unit, wherein the calibration unit comprises a reference resistors and the constant current source. The calibrating comprises: (a) measuring the higher reference resistor using an external National Institute for Standards Traceability (NIST) compliant Multimeter in 4 wire resistor measurement mode; (b) connecting higher reference resistor and lower reference resistor in series; (c) applying constant current to reference resistors from constant current source; (d) measuring the voltages across the both reference resistors using an external NIST compliant Multimeter in voltage measurement mode; (e) determine the lower reference resistor value from (a) higher reference resistor value and (d) ratio of both voltages. Thus the lower reference resistor can have the same accuracy as higher reference resistor. Finally high current VI source or power supply can have precision using high accurately calibrated lower reference resistor.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, one or more of the most important method steps may be executed by such an apparatus.

Depending on certain implementation requirements, embodiments of the invention can be implemented in hardware or in software. The implementation can be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non—transitionary.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are advantageously performed by any hardware apparatus.

The apparatus described herein may be implemented using a hardware apparatus, or using a computer, or using a combination of a hardware apparatus and a computer.

The apparatus described herein, or any components of the apparatus described herein, may be implemented at least partially in hardware and/or in software.

The methods described herein may be performed using a hardware apparatus, or using a computer, or using a combination of a hardware apparatus and a computer.

The methods described herein, or any components of the apparatus described herein, may be performed at least partially by hardware and/or by software.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. An apparatus for performing a calibration, the apparatus comprising:
a power source; and
a calibration circuit, wherein the calibration circuit comprises:
a first resistor with a first resistance and operable to be used in a calibration of the power source;
a second resistor with a second resistance and operable to be used in the calibration of the power source, wherein the second resistance is smaller than the first resistance;
wherein the calibration circuit is configured to allow for a measurement of the first resistance of the first resistor; and
wherein the calibration circuit is also configured to form a series connection comprising the first resistor and of the second resistor; and
wherein the calibration circuit is configured to allow for at least two voltage measurements between at least two different pairs of circuit nodes of the series connection, wherein a same current is applied during the at least two voltage measurements, and wherein the calibration circuit is configured to derive the second resistance of the second resistor based on the at least two voltage measurements and a result of the measurement of the first resistance of the first resistor, wherein the at least two voltage measurements comprise a measurement of a first voltage drop over the first resistor and a measurement of a second voltage drop over the second resistor, wherein the calibration circuit is further configured to derive the second resistance based on the measurement of the first resistance and a ratio of the first voltage drop and the second voltage drop, wherein the first resistance of the first resistor is at least 10 times larger than the second resistance of the second resistor, and wherein the calibration circuit is further configured to allow for a 4-wire precision measurement of the first resistance of the first resistor.

2. The apparatus according to claim 1, wherein the calibration circuit is further configured to derive the second resistance based on the measurement of the first resistance, the first voltage drop and the second voltage drop.

3. The apparatus according to claim 1, wherein the second resistance of the second resistor is smaller than 1 ohm.

4. The apparatus according to claim 1, wherein the calibration circuit further comprises a current source, and wherein the calibration circuit is configured to couple the current source in series with the first resistor and the second resistor while the at least two voltage measurements are performed, and wherein the current source is configured to provide identical currents during the at least two voltage measurements.

5. The apparatus according to claim 1, wherein the calibration circuit further comprises switches, wherein the switches are configured to couple the first resistor and the second resistor in a first switch state wherein a resistance of a series connection is effective, and
wherein the switches are further configured to couple the first resistor wherein the first resistance of the first resistor is effective in a second switch state, and
wherein the switches are further configured to couple the second resistor wherein the second resistance of the second resistor is effective in a third switch state.

6. The apparatus according to claim 5,
wherein a first switch of the switches is coupled between a first terminal of the first resistor and a first supply line,
wherein a second switch of the switches is coupled between the first terminal of the first resistor and a first sense line,
wherein a third switch of the switches is coupled between a first terminal of the second resistor and the first supply line,
wherein a fourth switch of the switches is coupled between the first terminal of the second resistor and the first sense line,
wherein a fifth switch of the switches is coupled between a second terminal of the first resistor and a second supply line,
wherein a sixth switch of the switches is coupled between the second terminal of the first resistor and a second sense line,
wherein a seventh switch of the switches is coupled between a second terminal of the second resistor and the second sense line,
wherein in the first switch state the first switch, the second switch and the seventh switch are closed,
wherein in the second switch state the first switch, the second switch, the fifth switch and the sixth switch are closed, and
wherein in the third switch state the third switch, the fourth switch and the seventh switch are closed.

7. The apparatus according to claim 1, wherein the calibration circuit is configured to provide a 4-wire connection of the first resistor and the second resistor with the power source.

8. The apparatus according to claim 1, wherein the calibration circuit is configured to couple the first resistor to the power source for calibrating a first current range of the power source, and
wherein the calibration circuit is configured to couple the second resistor to the power source for calibrating a second current range of the power source, and
wherein the first current range comprises smaller currents than the second current range.

9. The apparatus according to claim 1, wherein the calibration circuit further comprises a reference voltage source operable to be used for calibration of a voltmeter of the power source.

10. The apparatus according to claim 1, wherein the calibration circuit further comprises a memory unit configured to store reference values, wherein the reference values comprise a result of the measurement of the first resistance and/or the derived second resistance of the second resistor.

11. A tester for testing a device under test, the tester comprising:
a controlled power source, and
a calibration circuit for calibrating a power source, the calibration circuit comprising:
a first resistor with a first resistance operable to be used in a calibration of the power source; and
a second resistor with a second resistance operable to be used in the calibration of the power source, wherein the second resistance is smaller than the first resistance;
wherein the calibration circuit is configured to allow for a measurement of the first resistance of the first resistor; and
wherein the calibration circuit is configured to form a series connection comprising the first resistor and of the second resistor; and
wherein the calibration circuit is configured to provide at least two voltage measurements between at least two different pairs of circuit nodes of the series connection, wherein a same current is applied during the at least two voltage measurements, wherein the calibration circuit is further configured to derive the second resistance of the second resistor based on the at least two voltage measurements and a result of the measurement of the first resistance of the first resistor, wherein the at least two voltage measurements comprise a measurement of a first voltage drop over the second resistor and a measurement of a second voltage drop over the series connection of the first resistor and the second resistor, wherein the calibration circuit is further configured to derive the second resistance based on the measurement of the first resistance, the first voltage drop and the second voltage drop, wherein the first resistance of the first resistor is at least 10 times larger than the second resistance of the second resistor, and wherein the calibration circuit is further configured to allow for a 4-wire precision measurement of the first resistance of the first resistor.

12. A method for deriving a resistance of a resistor in a calibration arrangement, the method comprising:
measuring a first resistance of a first resistor;
forming a series connection of the first resistor and a second resistor, wherein the second resistor comprises a second resistance;
measuring at least two voltages between at least two different pairs of circuit nodes of the series connection, when a same current is applied during the at least two voltage measurements, wherein the at least two voltage measurements comprise a measurement of a first voltage drop over the second resistor and a measurement of a second voltage drop over the series connection of the first resistor and the second resistor; and deriving the second resistance of the second resistor on the basis of the at least two measured voltages and a result of the measurement of the first resistance of the first resistor, and wherein the measurement of the first resistance comprises a 4-wire precision measurement, and deriving the second resistance based on the measurement of the first resistance, the first voltage drop and the second voltage drop, wherein the first resistance of the first resistor is at least 10 times larger than the second resistance of the second resistor.

13. A non-transitory digital storage medium having a computer program stored thereon that when executed performs a method of deriving a resistance of a resistor in a calibration arrangement, said method comprising:

measuring a first resistance of a first resistor;

forming a series connection of the first resistor and a second resistor, wherein the second resistor comprises a second resistance;

measuring at least two voltages between at least two different pairs of circuit nodes of the series connection, when a same current is applied during the at least two voltage measurements, wherein the at least two voltage measurements comprise a measurement of a first voltage drop over the first resistor and a measurement of a second voltage drop over the second resistor; and deriving the second resistance of the second resistor on the basis of the at least two measured voltages and a result of the measurement of the first resistance of the first resistor, and wherein the measurement of the first resistance comprises a 4-wire precision measurement, and deriving the second resistance based on the measurement of the first resistance and a ratio of the first voltage drop and the second voltage drop, wherein the first resistance of the first resistor is at least 10 times larger than the second resistance of the second resistor.

* * * * *